United States Patent
Chu et al.

(10) Patent No.: US 9,368,545 B2
(45) Date of Patent: Jun. 14, 2016

(54) ELEVATED PHOTODIODES WITH CROSSTALK ISOLATION

(71) Applicant: Taiwan Semiconductor Manufacturing Company, Ltd., Hsin-Chu (TW)

(72) Inventors: Yi-Shin Chu, Hsin-Chu (TW); Cheng-Tao Lin, Kaohsiung (TW); Meng-Hsun Wan, Taipei (TW); Szu-Ying Chen, Toufen Township (TW); Jen-Cheng Liu, Hsin-Chu (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/560,676

(22) Filed: Dec. 4, 2014

(65) Prior Publication Data

US 2015/0118787 A1    Apr. 30, 2015

Related U.S. Application Data (62) Division of application No. 13/654,159, filed on Oct. 17, 2012, now Pat. No. 8,933,527.

(60) Provisional application No. 61/677,828, filed on Jul. 31, 2012.

(51) Int. Cl.
*H01L 27/146* (2006.01)
*H01L 27/30* (2006.01)

(52) U.S. Cl.
CPC ...... *H01L 27/14689* (2013.01); *H01L 27/1463* (2013.01); *H01L 27/14665* (2013.01); *H01L 27/14692* (2013.01); *H01L 27/14643* (2013.01); *H01L 27/301* (2013.01); *H01L 27/307* (2013.01)

(58) Field of Classification Search
CPC ............ H01L 27/14669; H01L 27/1463; H01L 27/14665; H01L 27/14692; H01L 27/307; H01L 27/30; H01L 27/301; H01L 27/305; H01L 27/14645; H01L 27/1464; H01L 25/167; H01L 27/146; H01L 27/14601; H01L 27/1492
See application file for complete search history.

(56) References Cited

U.S. PATENT DOCUMENTS

| 5,936,261 A | 8/1999 | Ma et al. |
| 2004/0036010 A1 | 2/2004 | Hsieh et al. |

(Continued)

FOREIGN PATENT DOCUMENTS

| JP | 2000156488 | 6/2000 |
| KR | 100850289 | 8/2008 |
| KR | 100935771 | 12/2009 |

OTHER PUBLICATIONS

Ihama, M., et al., "Proposal of New Organic CMOS Image Sensor for Reduction in Pixel Size," Fujifilm Research & Development (No. 55-2010), UDC 621.383.7, Original paper received Nov. 25, 2009, pp. 14-17.

(Continued)

*Primary Examiner* — Galina Yushina
(74) *Attorney, Agent, or Firm* — Slater Matsil, LLP (57) ABSTRACT

A device includes a plurality of isolation spacers, and a plurality of bottom electrodes, wherein adjacent ones of the plurality of bottom electrodes are insulated from each other by respective ones of the plurality of isolation spacers. A plurality of photoelectrical conversion regions overlaps the plurality of bottom electrodes, wherein adjacent ones of the plurality of photoelectrical conversion regions are insulated from each other by respective ones of the plurality of isolation spacers. A top electrode overlies the plurality of photoelectrical conversion regions and the plurality of isolation spacers.

19 Claims, 10 Drawing Sheets

(56) References Cited

U.S. PATENT DOCUMENTS

| | | | |
|---|---|---|---|
| 2008/0079102 A1* | 4/2008 | Chen | H01L 27/14692 257/431 |
| 2009/0072122 A1 | 3/2009 | Tada et al. | |
| 2009/0134485 A1 | 5/2009 | Lee | |
| 2010/0060769 A1 | 3/2010 | Inuiya | |
| 2010/0193848 A1* | 8/2010 | Lee | H01L 27/14667 257/294 |
| 2011/0019050 A1* | 1/2011 | Yamashita | H01L 31/18 348/308 |
| 2011/0042552 A1* | 2/2011 | Furuya | H01L 27/14621 250/208.1 |
| 2011/0278541 A1 | 11/2011 | Huang et al. | |
| 2012/0012965 A1 | 1/2012 | Maeda | |
| 2012/0146173 A1 | 6/2012 | Ohta et al. | |

OTHER PUBLICATIONS

Ihama, M., et al., "CMOS Image Sensor with a Thin Overlaid Panchromatic Organic Photoconductive Layer as the Best Candidate for Sensors with Reduced Pixel Size," 2009 International Image Sensor Workshop, Jun. 26-28, 2009, Bergen, Norway, 4 pgs.

* cited by examiner

ELEVATED PHOTODIODES WITH CROSSTALK ISOLATION

PRIORITY CLAIM AND CROSS-REFERENCE

This application is a divisional of U.S. patent application Ser. No. 13/654,159, entitled "Elevated Photodiodes with Crosstalk Isolation," filed on Oct. 17, 2012, which application claims the benefit of the following provisionally filed U.S. Provisional Application Ser. No. 61/677,828, filed Jul. 31, 2012, and entitled "Photodiode with Crosstalk Isolation;" which application is hereby incorporated herein by reference.

BACKGROUND

In image sensor chips that include elevated photo diodes, the elevated photodiodes are formed over interconnect structures of integrated circuits. Since the interconnect structures include metal lines and vias that are disposed in multiple dielectric layers, the elevated photodiodes are not affected by the interconnect structures. Furthermore, because photons do not need to penetrate through the interconnect structures, the routing of the metal lines and vias is easier since in the routing of metal lines and vias, spaces do not need to be reserved for the paths of light.

Conventional elevated photodiode structures include a plurality of bottom electrodes, a continuous photoelectric conversion film over the bottom electrodes, and a continuous top electrode over the photoelectric conversion film. This conventional structure suffers from electrical and optical crosstalk between adjacent pixels.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An image sensor chip (and the respective wafer) comprising elevated photodiodes and the method of forming the same are provided in accordance with various exemplary embodiments. The intermediate stages of forming the image sensor chip are illustrated. The variations of the embodiments are discussed. Throughout the various views and illustrative embodiments, like reference numbers are used to designate like elements.

Figure 1:
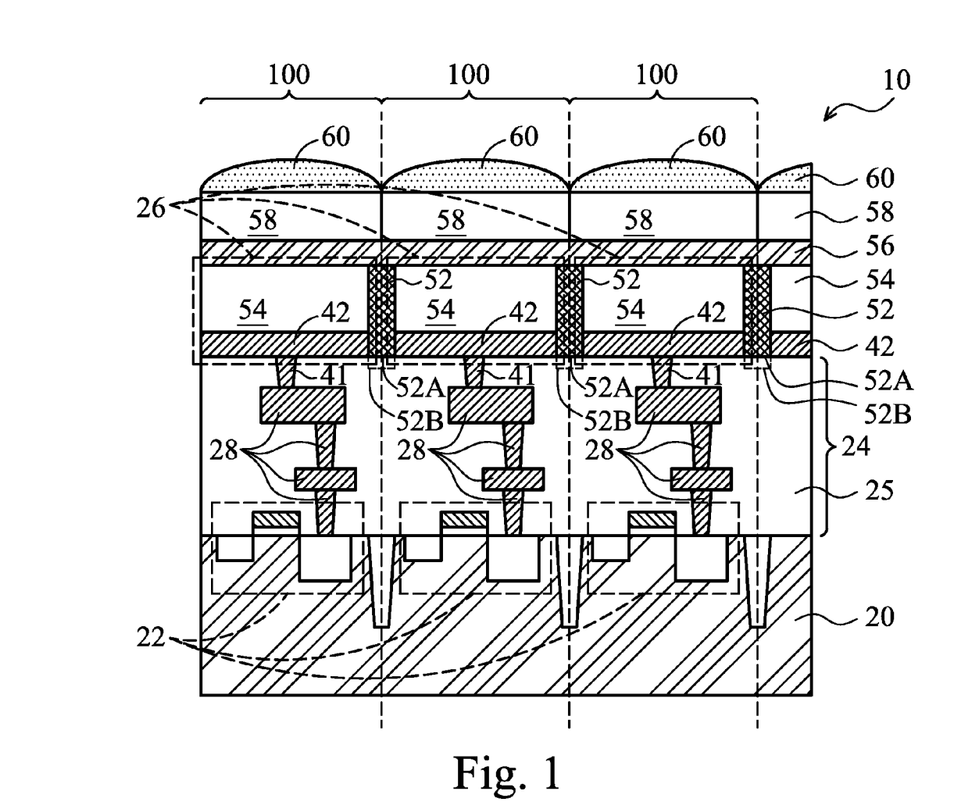
FIG. 1 illustrates a portion of an image sensor chip comprising elevated photodiodes in accordance with embodiments.

Turning to FIG. 1, an illustrative structure of image sensor chip 10 is shown including three adjacent pixel units 100. Image sensor chip 10 may be a part of an un-sawed semiconductor wafer, which is also denoted as 10. Three pixel units 100 are illustrated for clarity and convenience. Other numbers of pixel units and other arrangements (e.g. one dimensional, two dimensional arrays, etc.) are within the contemplated scope of the present disclosure.

Each of pixel units 100 includes read out circuits 22, metal lines and vias in interconnect structure 24, elevated photodiode 26 over interconnect structure 24, color filter 58 over elevated photodiode 26, and micro lens 60 over color filter 58. Photodiode 26 further includes bottom electrode 42, photoelectrical conversion region 54, and top electrode 56. Top electrode 56 may be a continuous layer in accordance with some embodiments, although the top electrodes 56 of each of pixel units 100 may also be separated from other top electrodes 56. Photoelectrical conversion region 54 of each of pixel units 100 is isolated from the photoelectrical conversion regions 54 of adjacent pixel units 100 by isolation spacers 52.

An illustrative process for manufacturing the structure of FIG. 1 is now described with regard to FIGS. 2 through 9. Starting with FIG. 2, an initial structure of image sensor chip 10 is provided, which includes substrate 20. In some embodiments, substrate 20 is a silicon substrate. Alternatively, substrate 20 is formed of other semiconductor materials such as silicon germanium, silicon carbon, III-V compound semiconductor materials, or the like. Circuits 22 are formed at the surface of substrate 20. Circuits 22 may include read out circuits, as illustrated, wherein each of pixel units 100 (FIG. 1) includes one of the read out circuits. The read out circuits may include one or a plurality of transistors, which may include transfer gates, row selectors, source followers, and/or reset transistors, for example. Furthermore, circuits 22 may include Image Signal Processing (ISP) circuits, which may include Analog-to-Digital Converters (ADCs), Correlated Double Sampling (CDS) circuits, row decoders, and/or the like.

Figure 2:
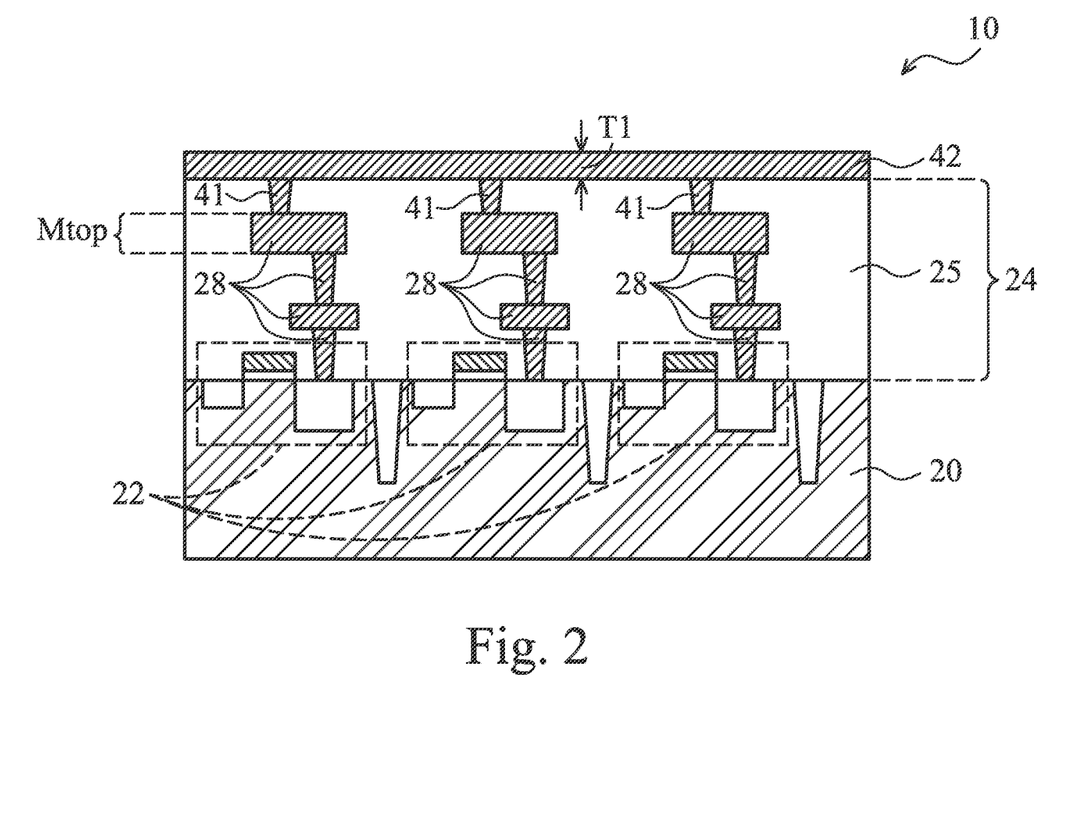
FIGS. 2 through 9 are cross-sectional views of intermediate stages in the manufacturing of the image sensor chip comprising elevated photodiodes in accordance with some exemplary embodiments.

Interconnect structure 24 is formed over circuits 22. Interconnect structure 24 includes a plurality of dielectric layers 25, which may comprise low-k dielectric materials having low dielectric constants (k values) lower than about 3.0, for example. Various metal interconnects such as metal lines and vias 28 are formed in dielectric layers 25, and electrically connect the read out circuits in circuits 22 to overlying elevated photodiodes 26 (FIG. 1). The metal interconnects and the methods for forming same are known in the art, and the details of which are not included here for clarity.

The plurality of metal layers include top metal layer Mtop, which is the topmost layer among the metal layers in interconnect structure 24. As shown, in FIG. 2, continuous bottom electrode layer 42 is formed over interconnect structure 24. The continuous bottom electrode layer 42 is electrically coupled to metal lines 28 in top metal layer Mtop through vias, plugs, or other interconnect structures, which is shown as top vias 41.

Metals or metal compounds such as aluminum, tungsten, copper, titanium nitride, chromium, or the like could be employed to form bottom electrode layer 42. Exemplary formation methods include Chemical Vapor Deposition (CVD), Physical Vapor Deposition (PVD), Plasma Enhanced Chemical Vapor Deposition (PECVD), Metal Organic Chemical Vapor Deposition (MOCVD), sputtering, and the like. Bottom electrode layer 42 may be formed to thickness T1 between about 0.05 μm and about 3 μm in some embodiments.

Figure 3:
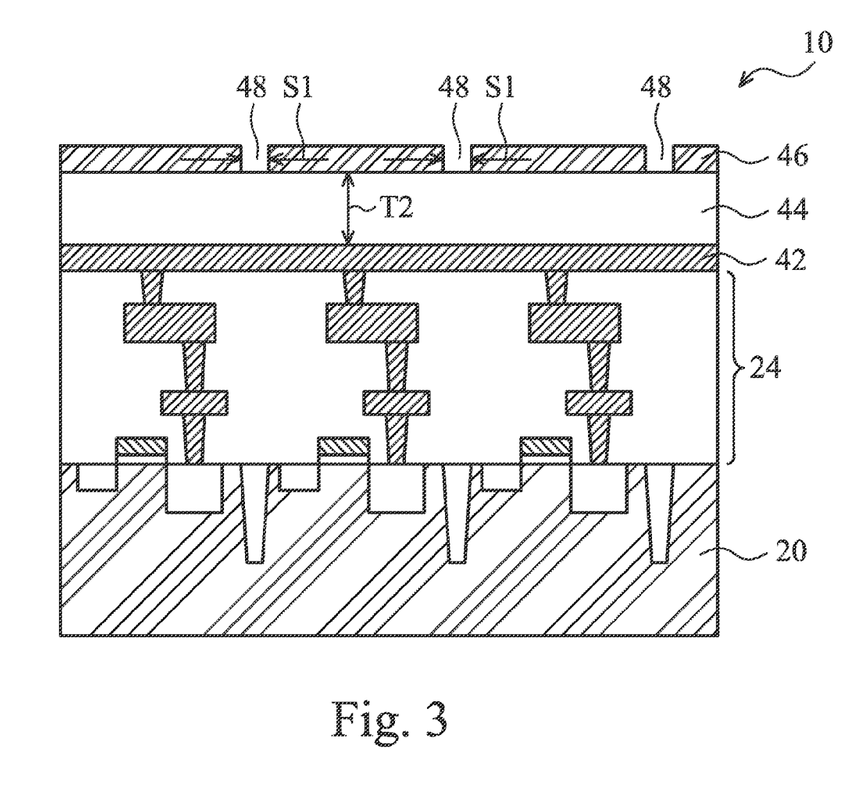

FIG. 3 illustrates the formation of sacrificial layer 44 above continuous bottom electrode layer 42. In some embodiment, sacrificial layer 44 is formed of or comprises an oxide such as silicon oxide, a nitride such as silicon nitride, or other acceptable dielectric material. Thickness T2 of sacrificial layer 44 may be between about 0.3 μm and about 0.5 μm in some embodiments. Sacrificial layer 44 may be deposited by one of CVD, PECVD, MOCVD, sputtering, spin on process, or the like. In alternative embodiments, sacrificial layer 44 may also be formed of or comprise a photo sensitive material, which may also be a polymer (such as polyimide), or the like. Photoresist layer 46 is formed atop sacrificial layer 44. Photoresist layer 46 is then patterned using known photolithography processes to form openings 48 corresponding to where the self-aligned isolation spacers 52 (FIG. 1) will be formed. In the illustrated embodiments, widths S1 of the resulting openings 48 are about 0.25 μm or less, corresponding to a fill factor of greater than sixty percent for 1.1 μm size pixels.

Figure 4:
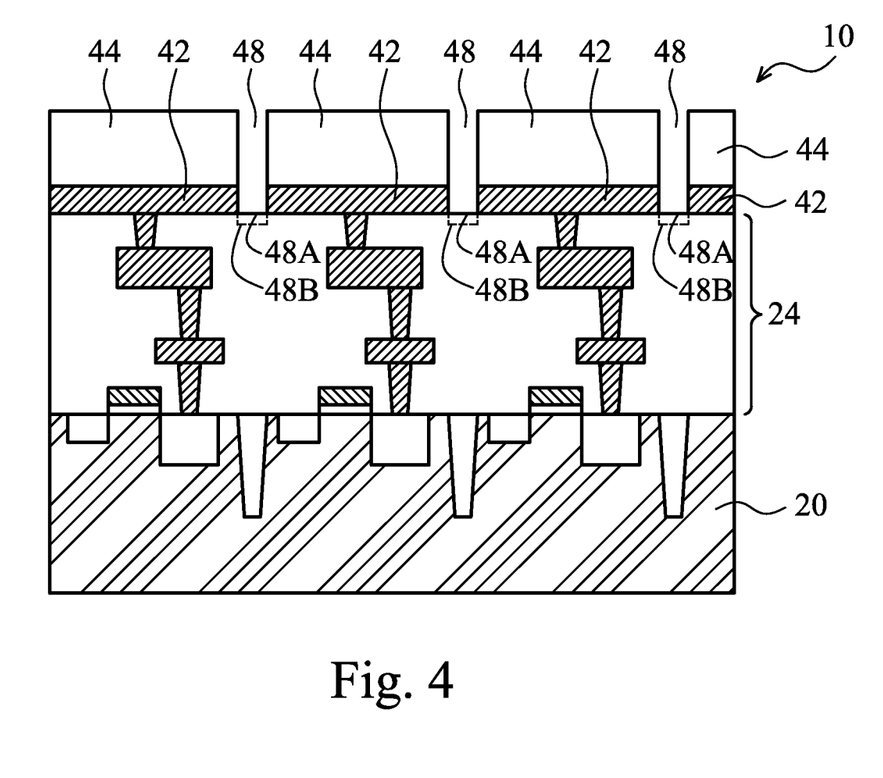
Figure 10:
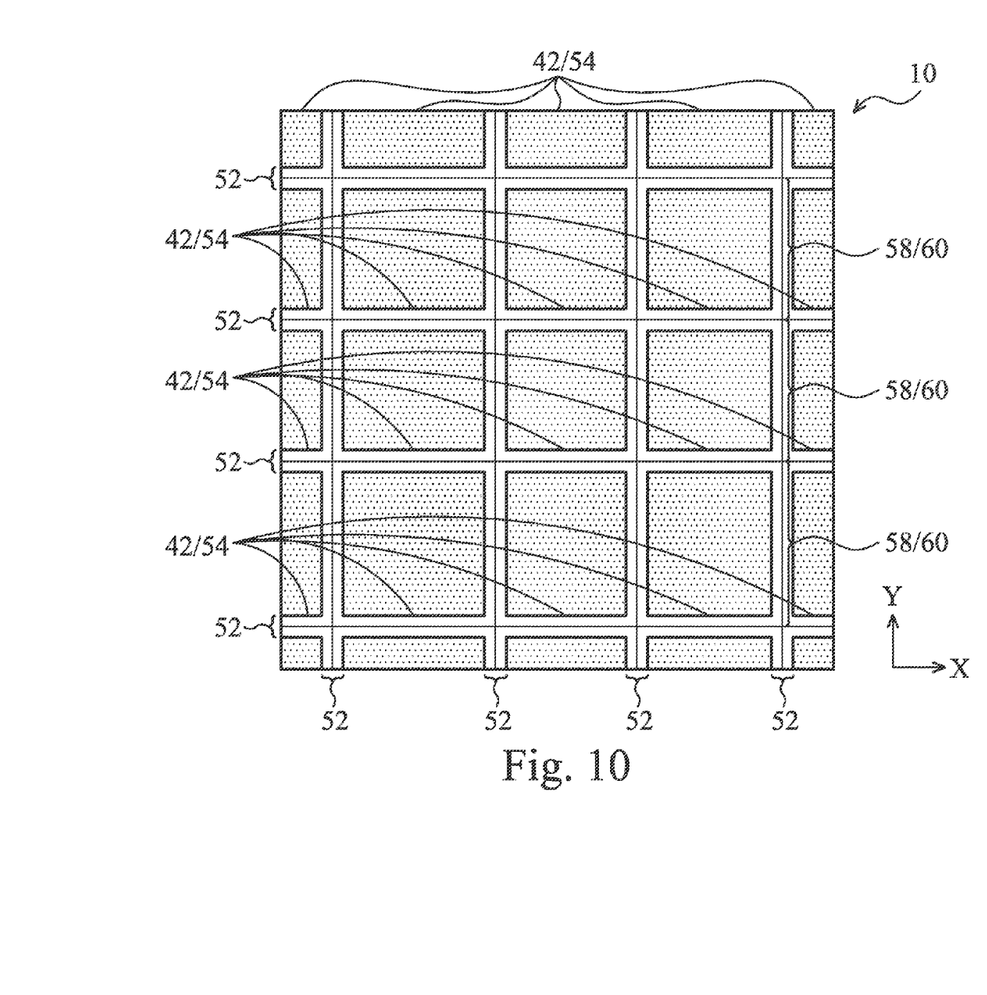
FIG. 10 illustrates a top view of the elevated photodiodes and the respective isolation structures.

FIG. 4 illustrates the structure after portions of sacrificial layer 44 and portions of bottom electrode layer 42 are etched, with photoresist layer 46 acting as an etching mask. Openings 48 hence extend down to penetrate through continuous bottom electrode layer 42. The bottoms of openings 48 may be level with (with the respective bottoms of openings 48 denoted as 48A), or lower than (with the respective bottoms of openings 48 denoted as 48B), the bottoms of bottom electrode layer 42. A dry etch such as a plasma etch may be contemplated for this step. The etch step may be an anisotropic etch, which provides for well-defined nearly vertical sidewalls in openings 48. A different etch chemistry or etch parameters may be preferable when etching bottom electrode layer 42 relative to the etch chemistry for etching sacrificial layer 44. Note that, as a result of the etch step, bottom electrode layer 42 is no longer continuous, and now comprises a plurality of discrete bottom electrodes, which are also denoted as bottom electrodes 42. In the top view of the structure in FIG. 4, openings 48 may form an opening grid to separate discrete bottom electrodes 42 from each other. The pattern of openings 48 is essentially the same as the pattern of isolation spacers 52, as shown in FIG. 10.

Figure 5:
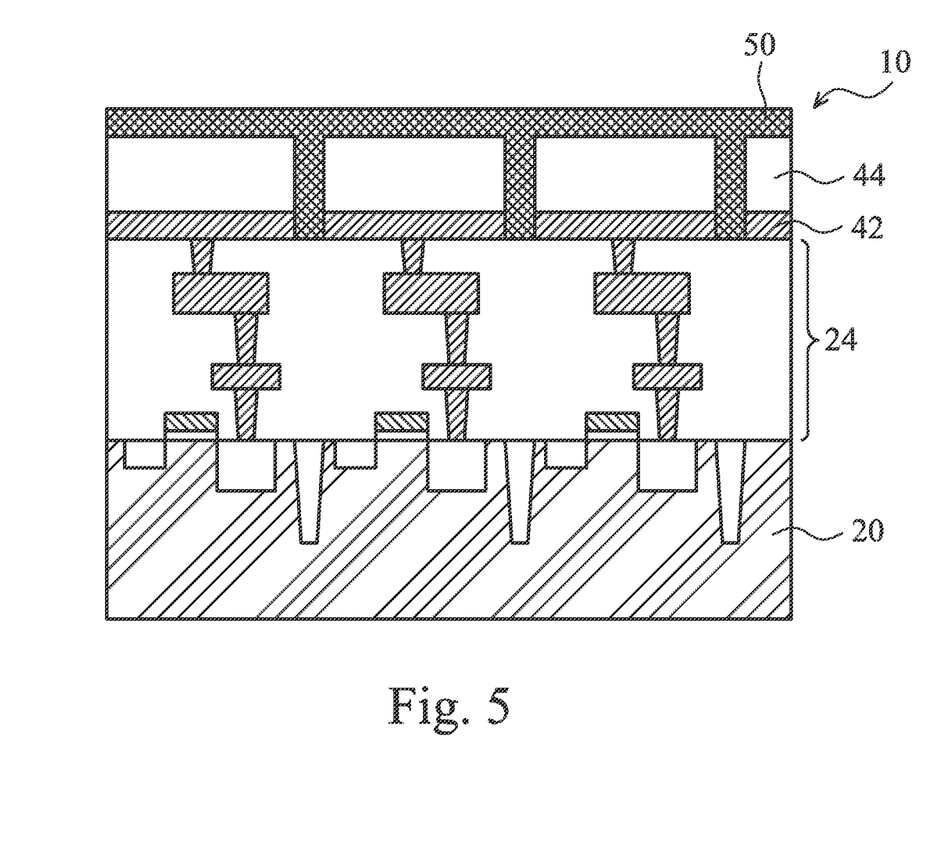

Referring to FIG. 5, isolation film 50, which is a dielectric film formed of a dielectric material, is next deposited over the structure in FIG. 4 and in openings 48. Among the many materials suitable for the isolation film are oxides, nitrides, oxynitrides of silicon, and the like. Although isolation film 50 and sacrificial layer 44 may be selected from same candidate materials, isolation film 50 and sacrificial layer 44 are formed of different materials, which have a high etching selectivity in the subsequent removal of sacrificial layer 44. The candidate deposition methods include spin-on process, a CVD process, a PECVD process, or some other suitable deposition process. The specific process is not crucial, provided the process provides for good filling of openings 48.

Figure 6:
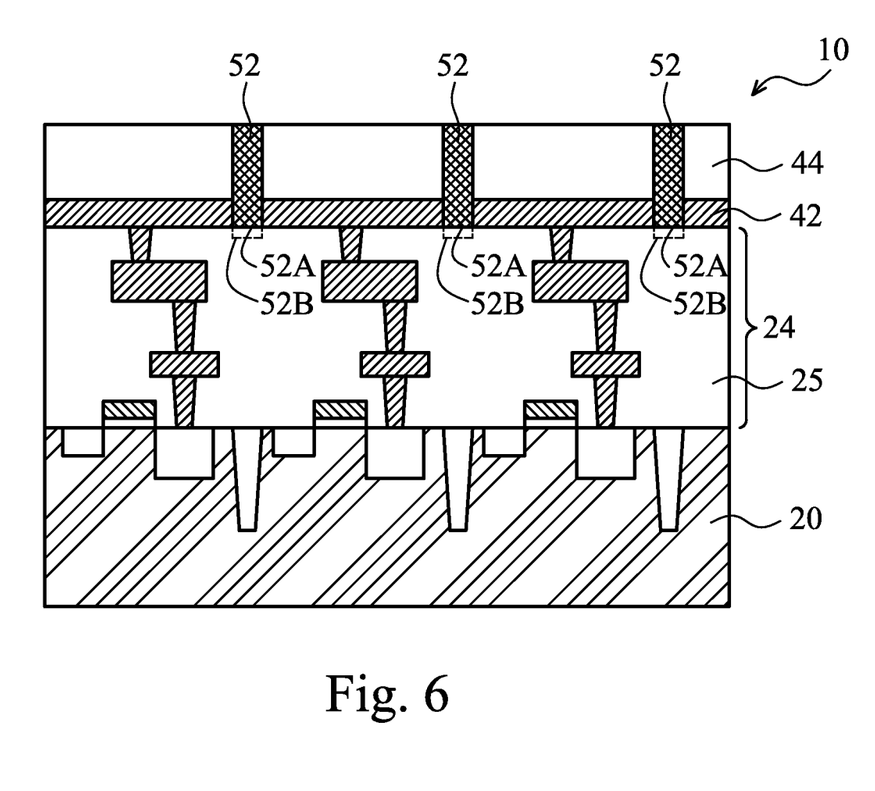

FIG. 6 illustrates the result of a planarization step, such as a Chemical Mechanical Polish (CMP) step, being performed. The portions of isolation film 50 overlying sacrificial layer 44 are removed, leaving those portions of isolation film 50 within openings 48. In some embodiments, a top portion of sacrificial layer 44 may also be removed during the CMP process as well as a result of an over polishing. Throughout the description, the remaining portions of isolation film 50 are referred to as isolation spacers 52. In some embodiments, the bottom surfaces of isolation spacers 52 are level with the bottom surfaces of bottom electrodes 42, and the respective bottom surfaces of isolation spacers 52 are denoted as 52A. In alternative embodiments, the bottom surfaces of isolation spacers 52 are lower than the bottom surfaces of bottom electrodes 42, with isolation spacers 52 extending into the top layer of dielectric layers 52, which may be a low-k dielectric layer. The respective bottom surfaces of isolation spacers 52 are denoted as 52B. Although FIG. 6 illustrates that isolation spacers 52 are discrete spacers, the illustrated discrete spacers 52 may be portions of continuous isolation spacers 52 that form a grid, as shown in FIG. 10, which illustrates a top view of isolation spacers 52.

Figure 7:
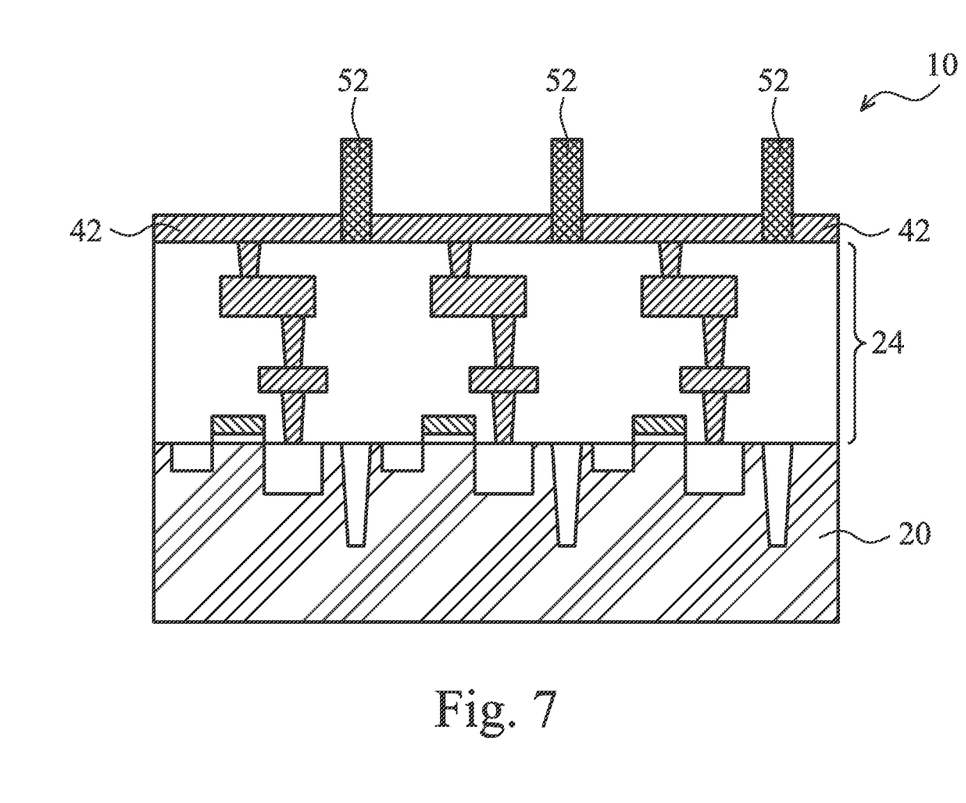

Next, as shown in FIG. 7, sacrificial layer 44 is removed, leaving isolation spacers 52 remaining Sacrificial layer 44 can be removed using an etch process such as a wet etch or a dry etch. It is desirable that by choosing appropriate materials for sacrificial layer 44 and isolation spacers 52, there may be a high etching selectivity between sacrificial layer 44 and isolation spacers 52 when sacrificial layer 44 is etched. Accordingly, sacrificial layer 44 can be removed without significantly removing much, if any, of isolation spacers 52.

Figure 8:
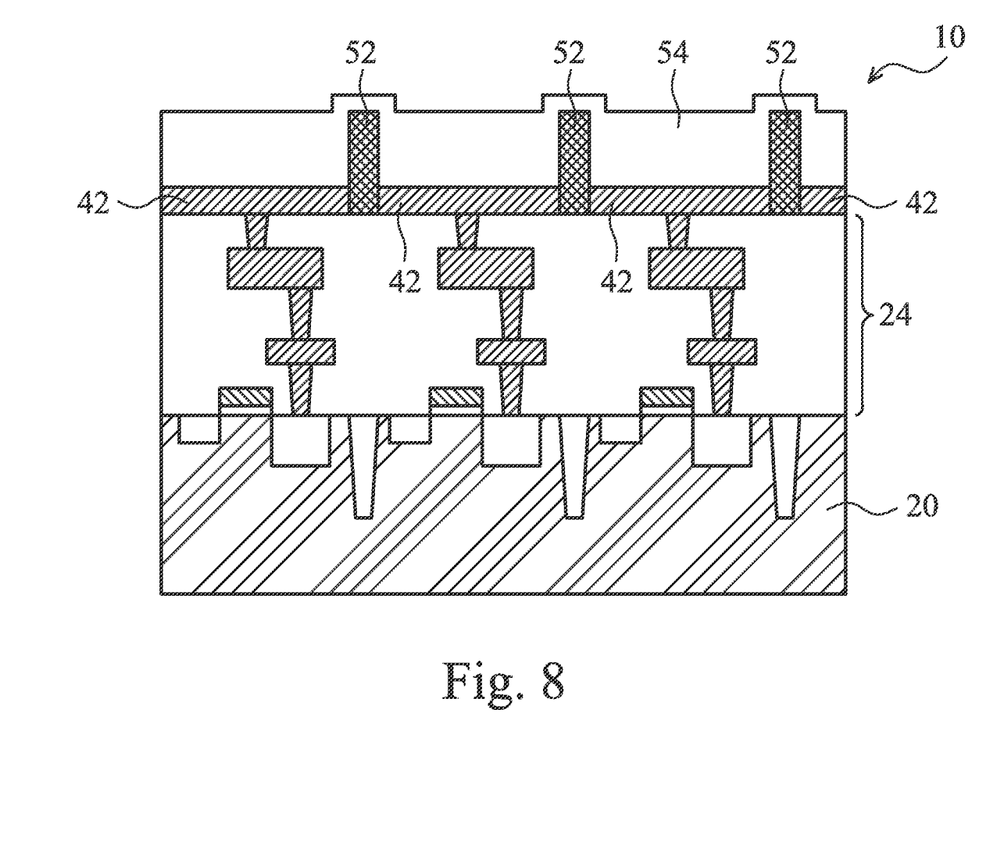
Figure 9:
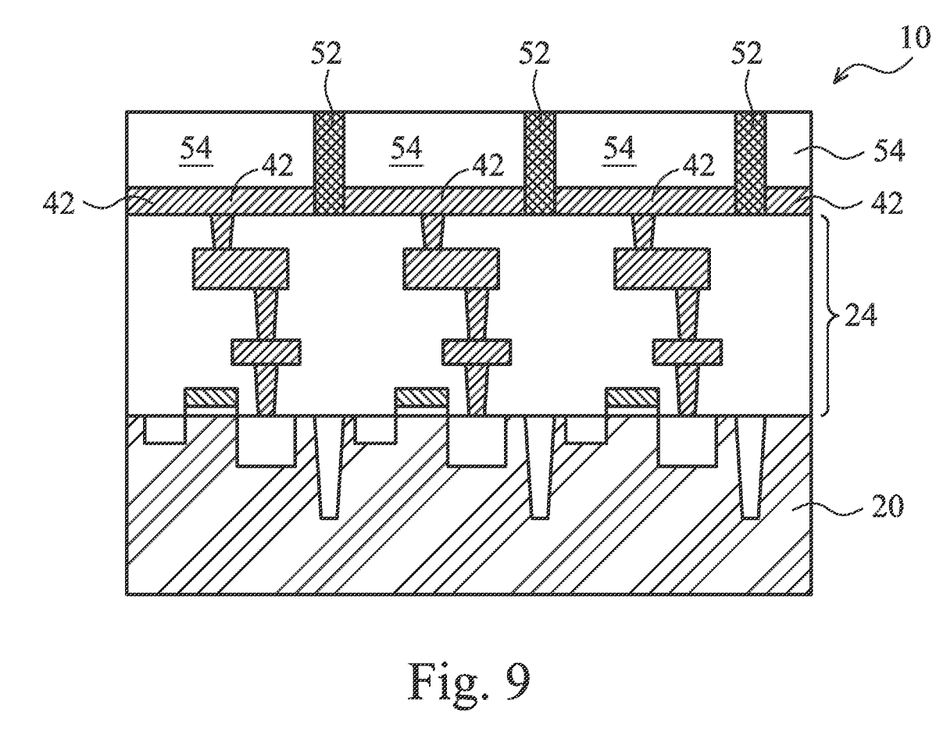

Referring to FIG. 8, photoelectrical conversion layer 54 is formed by a deposition process, a spin-coating process, or the like. Photoelectrical conversion layer 54 may comprise amorphous silicon, a quantum dot layer, an organic material, or the like. Photoelectrical conversion layer 54 is deposited to a thickness/height above that of the self-aligned isolation spacers 52. Photoelectrical conversion layer 54 is then planarized to the thickness/height of the self-aligned spacers, e.g., by a CMP process as shown in FIG. 9. As a result, the continuous photoelectrical conversion layer 54 is separated into discrete photoelectrical conversion regions, which are also denoted using reference numeral 54. The portions of photoelectrical conversion layer 54 above the top surfaces of isolation spacers 52 are removed, and hence the top surfaces of the resulting photoelectrical conversion regions 54 are substantially level with the top surfaces of isolation spacers 52. The edges of bottom electrodes 42 are vertically aligned to the respective edges of photoelectrical conversion regions 54. Photoelectrical conversion regions 54 have the function of generating electrons and holes in response to the stimulation of photons, and hence act as parts of photodiodes.

Referring back to FIG. 1, in a subsequent step, transparent top electrode 56 formed of a transparent conductive material, for instance, Indium Tin Oxide (ITO), is next formed atop photoelectrical conversion regions 54 and isolation spacers 52. The bottom surface of transparent top electrode 56 may be in contact with top surfaces of photoelectrical conversion regions 54 and isolation spacers 52. In subsequent processes, overlying structures such as color filters 58, micro lenses 60, protection layers (not shown), or the like, are formed.

As shown in FIG. 1, the pixels of image sensor chip 10 are discrete with one pixel per pixel unit 100. Those skilled in the art will recognize that one pixel unit 100 could alternatively comprise several pixels, such as a pixel configured to respond to red light (e.g., by way of an appropriate filter as it known in the art), a pixel configured to respond to green light, and a pixel configured to respond to blue light, within a pixel unit. While top electrode 56 is shown as continuous, in some embodiments one or more discrete top electrodes could be employed.

As shown in FIG. 1, due to the formation process of isolation spacers 52, the top surfaces of isolation spacers 52 may be level with the top surfaces of photoelectrical conversion regions 54. The bottom surfaces of isolation spacers 52 may be substantially level with, or lower than, the bottom surfaces of bottom electrodes 42. Furthermore, isolation spacers 52 define the top-view sizes of photoelectrical conversion regions 54 and the top view sizes of bottom electrodes 42.

FIG. 10 illustrates a top view of portions of the structure in FIG. 1, wherein isolation spacers 52 are shown as forming a grid, which include interconnected isolation spacer strips 52 extending in X and Y directions, which are perpendicular to each other. Bottom electrodes 42 and photoelectrical conversion regions 54 are formed in the grid, and are separated from each other by isolation spacers 52. Bottom electrodes 42 and photoelectrical conversion regions 54 may fills entireties of the grid openings of isolation spacers 52. The edges of bottom electrodes 42 and the edges of photoelectrical conversion regions 54 are in contact with the edges of isolation spacers 52. Color filters 58 and micro lenses 60 also form arrays, wherein the interfaces between neighboring color filters 58 and micro lenses 60 may overlap isolation spacers 52.

An advantageous feature that may be realized by some of the described embodiments is that they provide for a self-aligned isolation spacer process. This feature provides for a large fill factor since bottom electrodes 42 extend all the way to the edges of isolation spacers 52. With the formation of isolation spacers 52 (FIG. 1) to separate the otherwise continuous photoelectrical conversion layer 54, the optical crosstalk in the conventional continuous photoelectrical conversion layer no longer occurs. Furthermore, isolation spacers 52 also reduces or eliminates electric crosstalk since the electrons and holes generated in one discrete photoelectrical conversion region 54 of one pixel unit 100 is not able to be received by the bottom electrode of the adjacent pixel units 100.

In accordance with embodiments, a device includes a plurality of isolation spacers, and a plurality of bottom electrodes, wherein adjacent ones of the plurality of bottom electrodes are insulated from each other by respective ones of the plurality of isolation spacers. A plurality of photoelectrical conversion regions overlaps the plurality of bottom electrodes, wherein adjacent ones of the plurality of photoelectrical conversion regions are insulated from each other by respective ones of the plurality of isolation spacers. A top electrode overlies the plurality of photoelectrical conversion regions and the plurality of isolation spacers.

In accordance with other embodiments, a device includes a semiconductor substrate, and an interconnect structure overlying the semiconductor substrate, wherein the interconnect structure includes metal lines and vias therein. A plurality of bottom electrodes overlies and is electrically coupled to the metal lines and vias. A plurality of isolation spacers overlies the interconnect structure, wherein the plurality of isolation spacers is interconnected with each other to form a grid. A plurality of photoelectrical conversion regions is disposed in grid openings of the grid. A top electrode overlies the plurality photoelectrical conversion regions.

In accordance with yet other embodiments, a method includes forming a continuous bottom electrode, forming a sacrificial layer over the continuous bottom electrode, and patterning the sacrificial layer and the bottom electrode to form openings in the sacrificial layer and the continuous bottom electrode. The continuous bottom electrode is separated by the openings into a plurality of discrete bottom electrodes. The method further includes filling the openings in the sacrificial layer with an isolation film to form a plurality of isolation spacers, removing the sacrificial layer to reveal the plurality of discrete bottom electrodes, and forming a plurality of photoelectrical conversion regions on the plurality of discrete bottom electrodes, wherein adjacent ones of the plurality of photoelectrical conversion regions are separated from each other by the plurality of isolation spacers. A top electrode is formed over the plurality of photoelectrical conversion regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a plurality of isolation spacers separating a plurality of discrete bottom electrodes from each other, with edges of the plurality of discrete bottom electrodes contacting edges of the plurality of isolation spacers;
    filling spaces between the plurality of isolation spacers with a photoelectrical conversion material to form a plurality of photoelectrical conversion regions; and
    forming a continuous top electrode over the plurality of photoelectrical conversion regions, wherein
    forming the plurality of isolation spacers and the forming the plurality of discrete bottom electrode comprise:
        forming a continuous bottom electrode; forming a sacrificial layer over the continuous bottom electrode; and etching the sacrificial layer and the continuous bottom electrode to form openings in the sacrificial layer and the continuous bottom electrode, wherein the openings create the plurality of discrete bottom electrodes from the continuous bottom electrode.

2. The method of claim 1, wherein the sacrificial layer and the continuous bottom electrode are etched using a same etching mask.

3. The method of claim 1, wherein the openings formed by the etching extend into a dielectric layer underlying the continuous bottom electrode.

4. The method of claim 3, wherein the dielectric layer comprises a low-k dielectric material.

5. The method of claim 1, wherein the forming the sacrificial layer comprises depositing a dielectric material.

6. The method of claim 1, wherein each of the plurality of discrete bottom electrodes is electrically coupled to a corresponding read out circuit.

7. The method of claim 1 further comprising:
    forming an interconnect structure comprising a plurality of metal layers and low-k dielectric layers, wherein the plurality of discrete bottom electrodes is over the low-k dielectric layers.

8. A method comprising:
    forming a continuous bottom electrode;
    forming a sacrificial layer over the continuous bottom electrode;
    patterning the sacrificial layer and the continuous bottom electrode to form openings in the sacrificial layer and the continuous bottom electrode, wherein the continuous bottom electrode is separated by the openings into a plurality of discrete bottom electrodes;
    filling the openings with an isolation film to form a plurality of isolation spacers;
    removing the sacrificial layer to reveal the plurality of discrete bottom electrodes;

forming a plurality of photoelectrical conversion regions on the plurality of discrete bottom electrodes, wherein adjacent ones of the plurality of photoelectrical conversion regions are separated from each other by the plurality of isolation spacers; and forming a top electrode over the plurality of photoelectrical conversion regions.

9. The method of claim 8, wherein the openings further extend into a dielectric layer underlying the continuous bottom electrode.

10. The method of claim 9, wherein the dielectric layer underlying the continuous bottom electrode comprises a low-k dielectric material.

11. The method of claim 9, wherein the dielectric layer and the plurality of isolation spacers form distinguishable interfaces lower than a bottom surface of the continuous bottom electrode.

12. The method of claim 8 further comprising, after the filling the openings with the isolation film, performing a planarization to remove excess portions of the isolation film, wherein remaining portions of the isolation film form the plurality of isolation spacers.

13. The method of claim 8, wherein the forming the plurality of photoelectrical conversion regions comprises:

filling a photoelectrical conversion film into spaces left by the removed sacrificial layer; and performing a planarization to remove excess portions of the photoelectrical conversion film, wherein the excess portions are over the plurality of isolation spacers, and wherein remaining portions of the photoelectrical conversion film form the plurality of photoelectrical conversion regions.

14. The method of claim 8, wherein after the patterning the sacrificial layer and the bottom electrode to form the openings, the openings are interconnected to each other to form a continuous grid.

15. The method of claim 8, wherein the patterning the sacrificial layer and the continuous bottom electrode comprises an anisotropic etching.

16. The method of claim 8, wherein the forming the sacrificial layer comprises depositing a dielectric material.

17. A method comprising:

forming a continuous bottom electrode over and contacting a dielectric layer, with conductive features located in the dielectric layer;

forming a sacrificial layer over the continuous bottom electrode;

patterning the sacrificial layer and the continuous bottom electrode using a same mask to form openings in the sacrificial layer and the continuous bottom electrode, wherein the continuous bottom electrode is separated by the openings into a plurality of discrete bottom electrodes, and the openings extend into the dielectric layer;

filling the openings with an isolation film to form a plurality of isolation spacers;

removing the sacrificial layer to reveal the plurality of discrete bottom electrodes; and forming a plurality of photoelectrical conversion regions in spaces left by the removed sacrificial layer.

18. The method of claim 17 further comprising forming a blanket top electrode over the plurality of photoelectrical conversion regions.

19. The method of claim 17, wherein the dielectric layer comprises a low-k dielectric material.

* * * * *